United States Patent [19]

Holmes

[11] 3,986,027

[45] Oct. 12, 1976

[54] STEREO SCANNING MICROPROBE

[75] Inventor: Duane C. Holmes, Milpitas, Calif.

[73] Assignee: American Optical Corporation, Southbridge, Mass.

[22] Filed: Apr. 7, 1975

[21] Appl. No.: 565,970

[52] U.S. Cl. .............................. 250/310; 250/311; 178/6.5
[51] Int. Cl.² .................. G01N 23/00; G21K 7/00; H04N 9/54; H04N 9/60
[58] Field of Search .................... 250/309, 310, 311; 178/6.5

[56] References Cited
UNITED STATES PATENTS

| | | | |
|---|---|---|---|
| 3,235,727 | 2/1966 | Shapiro | 250/310 |
| 3,585,382 | 6/1971 | Suganuma | 250/310 |

FOREIGN PATENTS OR APPLICATIONS

| | | | |
|---|---|---|---|
| 675,017 | 7/1952 | United Kingdom | 178/6.5 |

Primary Examiner—Alfred E. Smith
Assistant Examiner—T. N. Grigsby
Attorney, Agent, or Firm—H. R. Berkenstock, Jr.; William C. Nealon

[57] ABSTRACT

A scanning electron microprobe and display system adaptable to stereoscoptic or side-by-side viewing of an image for comparison on a television type monitor. The apparatus includes means for scanning the microprobe beam in a raster over a specimen and displaying the image on the cathode ray tube viewer. The microprobe beam scan is synchronized to the beam of the cathode ray tube and the cathode ray tube horizontal scan is blanked over a portion of its extent for sequential fields. For stereo viewing, the angle of incidence of the microprobe is varied in relation to the blanking sequence to provide side-by-side images on the cathode ray tube, each of which are generated from different microprobe incidence angles.

7 Claims, 13 Drawing Figures

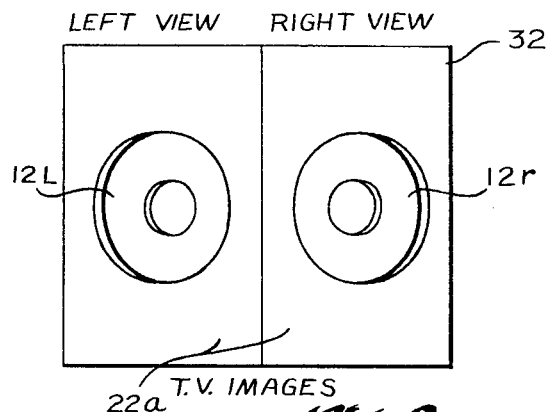
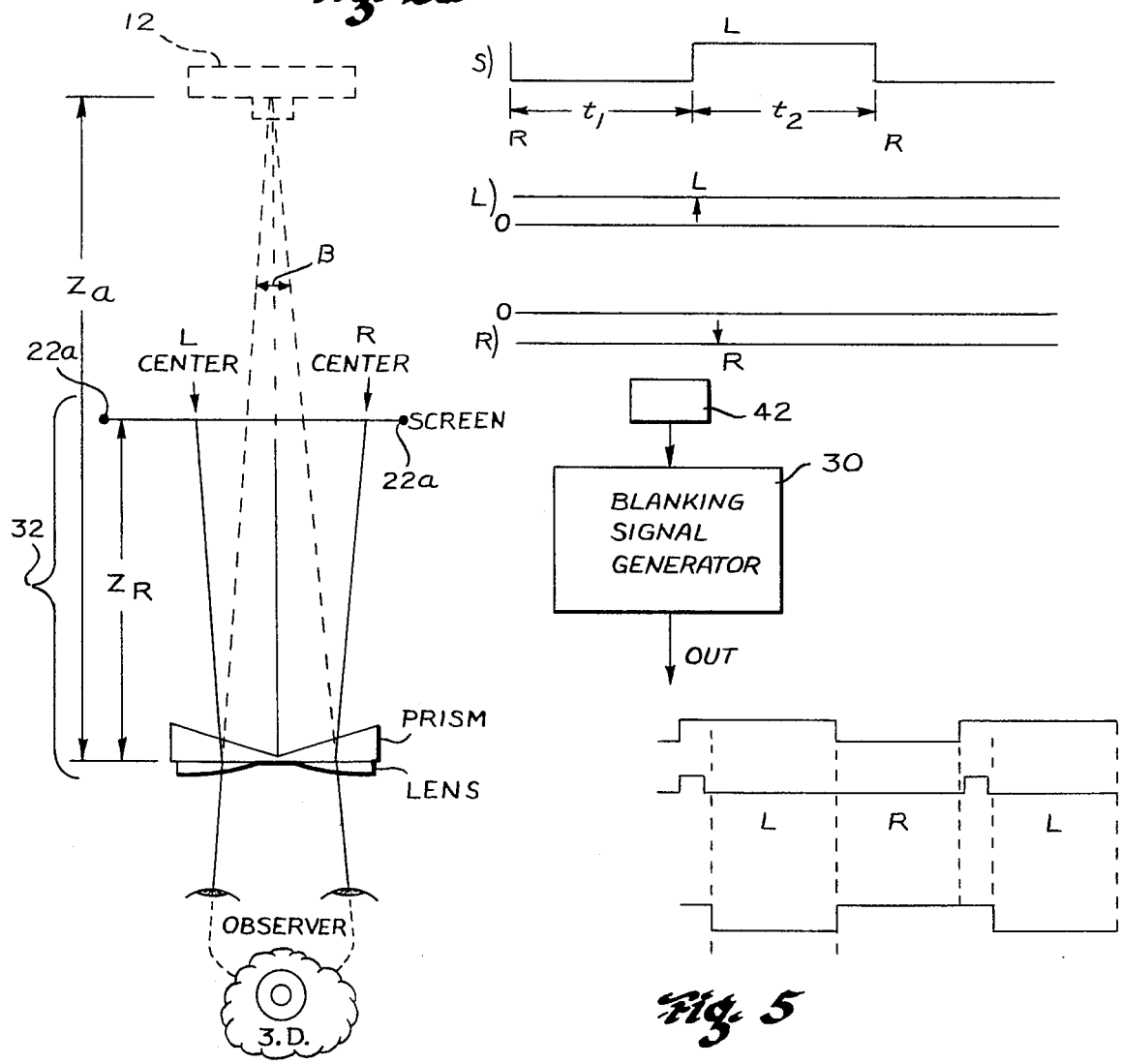

Fig. 3a    MAG. "M"

Fig. 3b    MAG. "2×M"

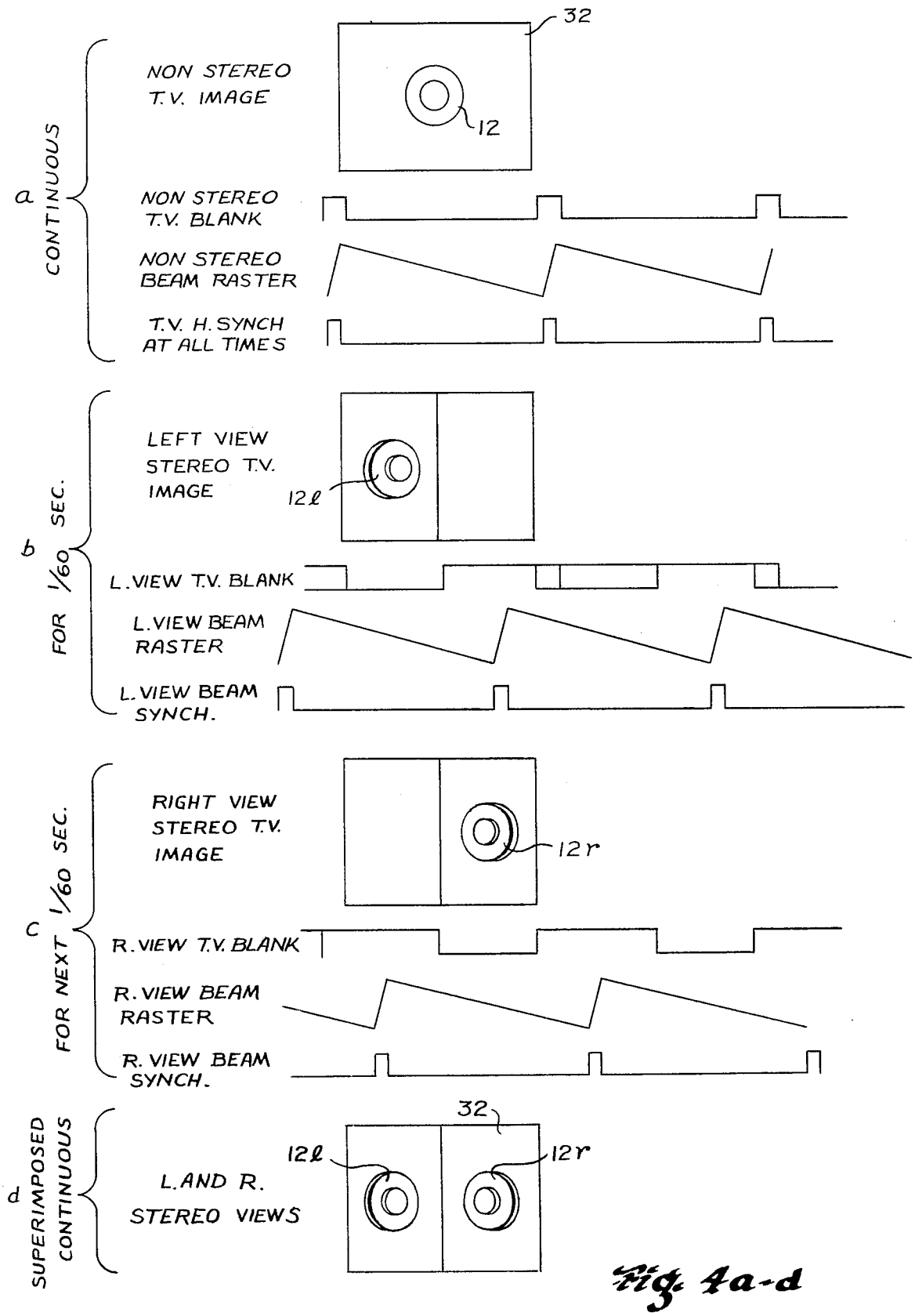
Fig. 4a-d

STEREO SCANNING MICROPROBE

BACKGROUND OF THE INVENTION

The present invention relates to the general subject of electron optical systems and more particularly to such systems wherein a beam of corpuscular particles is scanned over a selected area of a specimen and the electrical signal derived therefrom is displayed upon a television type monitor (raster driven cathode ray tube).

With the development of electron microprobes systems having a beam of sufficiently high brightness (content of energy) so that high speed scanning of a specimen surface, e.g. scanning at rates comparable to those exhibited by commercial television systems, "Real Time" Scanning Electron Microscopes having high magnification viewable on TV screens have become a commercial reality. With the advent of such "TV-linked" systems have come a number of changes in the style and practice of electron microscopy. Now, an electron beam, having a high concentration of electrons, can be finely focussed (to a spot diameter of a few Angstroms), and caused to scan a specimen surface in synchronism with the electron beam of a CRT monitor.

The impact of the electron beam upon the specimen within the microscope can be detected by any of a variety of devices (x-ray detectors, backscattered electron detectors, etc.) and the signal of such device used to modulate the brightness of the TV tube beam. In the case of the very high brightness sources for electron beams (field emission tips) sufficient signal to noise level can be maintained such that even at very high magnification (50,000× or more) a real time, TV rate scan and display may be enjoyed. Scientists and researchers have have found tremendous advantage in being able to immediately view on a TV screen a highly magnified specimen surface, to compare and select the areas of relative interest, and the determination of suitable sights for photomicrographs. As the interest in highly magnified specimen examination forces higher resolution of photomicrographs, advantages of the developments within the TV industry have become available as building blocks for further advance in state of the art of Field Emission microscopy. For example, as TV monitors having higher resolution (higher numbers of lines and a variety of times of persistence phosphors have become available, the scan of the electron beam on the specimen has still been synchronizeable with the TV type monitor, with the result of improvements in the performance of the total system. For example, specimen scanning rasters of 1000 line and 2500 lines are common, with additionally selectable, variable interlace patterns, either sequential or non-sequential, depending upon the particular advantages sought from the system. (See, for example, U.S. Pat. Nos. 3,767,926 (Re.28,153) and application Ser. No. 534,975 filed 12/20/74.

It has also been determined that a variety of additional information may be gained from a specimen if, while scanning the specimen for response in a particular response (e.g. angle of beam impingent, secondly, backscattered electron detector, x-ray mapping) and direct comparison with a collateral specimen response (such as above, or scanning transmission bombardment) additional information might be gained from the specimen. The ability of the field emission microprobe system to respond with real time response lends additional advantages to the above investigations — particularly for simultaneous comparative viewing such as in a stereoscoptive type of presentation.

The present invention is an improvement of an electron optical system adopted to a TV type imaging device and synchronized in raster pattern to the system electron probe.

The present system finds particular advantage in such systems as those in which two immediate images need to be compared such that simultaneous viewing gives the viewer information beyond that available from single images. Particularly, in those situations where separate images of an object are formed such that when these are viewed in particular relation, stereopsis may be observed, the viewer gains depth information which cannot be obtained from the single image. The current development of the electron microscope art is such that separate, coordinated photomicrographs may be prepared and later compared in suitable viewing device such as the stereoptic information can be extracted. Considerable research efforts have been expended in recent years toward the development of a real time stereo capability in a high magnification electron microscope. Real time systems capable of operation in lower magnifications (2000×) have been achieved with multicolor systems or with comparatively low resolution.

It is not until the present advance that a high resolution, high magnification scanning electron microscope has become available which could be developed as a satisfactory indistrial or research quality instrument.

In addition the present invention offers the flexibility of an electron microscope which allows the simultaneous viewing of an image which is formed from the different returns of two electron detectors. Specific examples may include the viewing of a backscattered electron image with a secondary electron image, in side-by-side relation and simultaneously.

It is thus one of the several objects of the present invention to provide such simultaneous viewing of two images of the same selected surface area of sample, however simultaneously producing separate images, carrying different information such that direct comparison may be made of the images with the assurance that the same specific surface of the specimen is being viewed.

SUMMARY OF THE INVENTION

In accordance with certain features of the present invention, a scanning electron microprobe and display system is disclosed which is adaptable to stereoscoptic or side-by-side image comparison on a television type monitor. The apparatus includes means for scanning the microprobe beam in a raster over a specimen and displaying the image on the cathode ray tube (CRT) viewer. Additionally, the microprobe beam scan is synchronized to the beam of the CRT and the CRT horizontal scan is blanked over a portion of its extent for sequential fields. For stereo viewing, the angle of incidence of the microprobe is varied in relation to the blanking sequence to provide side-by-side images on the CRT, which are generated from different microprobe incidence angles. The thus generated side-by-side images may be viewed with a stereo viewer or other means for the stereoptic effect.

In an alternative embodiment of the invention, additional means may be included to directly compare different emission from the sample, such as secondary electron emission vs. backscattered emission. It may be necessary to include additional detectors for such comparison.

DESCRIPTION OF THE DRAWINGS

The invention described herein is additionally illustrated in the attached drawings in which:

FIG. 4 is an illustrative view of phase shifting and synchronizing signals used for beam blanking.

FIG. 5 is a schematic diagram of control circuitry for the invention of FIG. 1.

DESCRIPTION OF A PREFERRED EMBODIMENT

Figure 1:
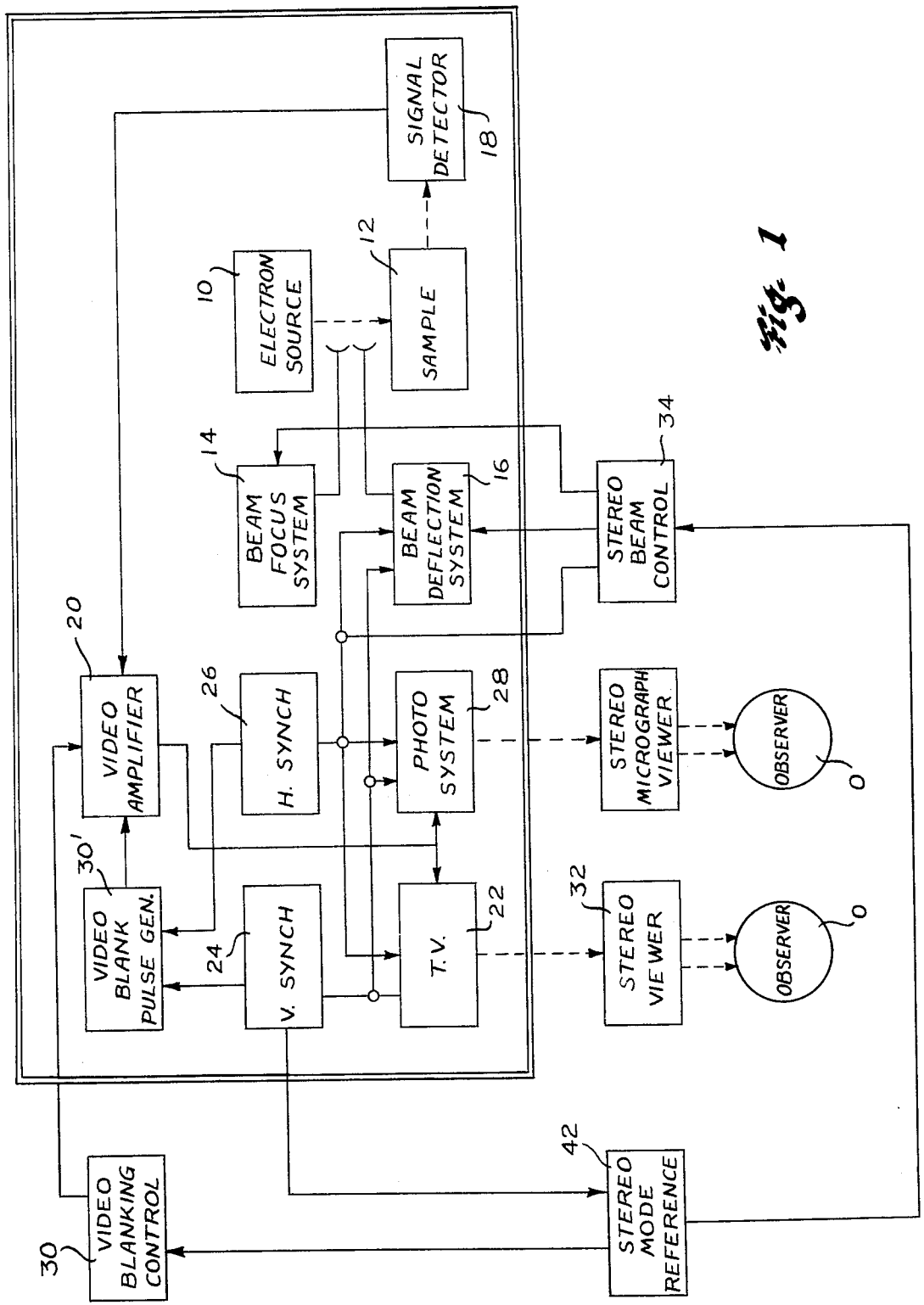
FIG. 1 is a block diagram of an embodiment of the invention for stereoptic viewing.

For an understanding of the operation of an electron microscope within which the present invention may be observed, reference may be had to one of the several patents issued which are owned by the assignee of the present invention. Among these are U.S. Pat. Nos. 3,678,333; 3,766,427; 3,767,926; Re. 28,153; 3,784,815 and 3,842,272. From such as these references it may be seen that a beam of electrons is produced by a source, which is indicated by reference numberal 10 on FIG. 1, which in these preferred embodiments is a field emission electron gun. The beam is directed upon a specimen 12 to be observed in a focused condition by focusing coils 14. The beam is scanned in a television type raster format by a deflection system 16; all of the foregoing being illustrated in the aforementioned references. Impingement of the electron beam upon the sample causes a variety of responsive emissions by the sample, depending in part upon the energy level of the impinging beam. In the illustrative embodiments where the beam energy is in the range of a few to tens of kilovolts (eg, 5 to 20kV) the responsive emissions may include secondary, backscattered and reflective electrons. X-Rays and ions may also be emitted depending upon beam energy and density. These are conventionally collected by a scintillation type detector 18 and routed to a signal amplifier 20 which, in turn, becomes the input to the television type monitor 22.

Prior to the present invention, only a single type of the responsive electrons could be collected at any one time and displayed in image form on a single monitor. As will be explained below, the present invention allows the simultaneous viewing of several types of these responsive electrons, such that two or more images may be simultaneously analyzed.

Referring back to the monitor 22, the writing beam of this cathode ray tube device is synchronized and phased to the raster of the deflection system 16 to ensure that each specific line of scan of the observed specimen is coordinated with the line of the image formed on the monitor 22. This is accomplished through the use of common synchronism sources 24 and 26, one for vertical control of the raster scan and one for the horizontal control. In this manner the intensity variations over the surface of the specimen which are caused by one or more of the changing parameters such as topography, composition, and electrostatic charge may be imaged on the surface to the monitor, in synchronization with the advance of the scanning microprobe.

Photomicrographs are produced with the aid of a photographic system 28 to capture and permanently retain the image of the monitor, usually on the inclusion of an additional monitor, of the general type of monitor 22. As is common in television systems, video blanking pulses are generated in video blanking control 30 to blank out the electron beam of the monitor during the video retrace of the raster scan. Particular mention of video blanking is made at this juncture, since special use of video blanking is employed in the production of multiple images on monitor 22 in accordance with the invention.

One embodiment of the present invention will be described which exhibits real time stereoptic viewing of a selected area of a specimen. Other embodiments which illustrate simultaneous comparative viewing of different responsive returns will be additionally described with reference to the stereo electron microscope. In the present embodiment of the invention, left and right views 12*l* and 12*r* of the sample are imaged on left and right halves of the monitor 22 (See FIG. 2). The stereo viewer 32 superimposes the two individual images for the eyes of the observer to resolve. To create these left and right views of the sample, the electron beam is caused to strike a preselected area on the sample by causing the beam to sequentially scan the selected area of the sample at two preselected, opposite scan angles. The amplitude of this scan angle, or more particularly, stereo incidence angle, influences the observable stereopsis, and is thus desirably controllable by the operator of the electron microscope. Accordingly, an operator control 34 is placed on the control panel of the instrument.

Stereo Mode reference control 36 is a reference signal generator which provides a signal to alternate the stereo incidence angle from the right viewing angle to the left viewing angle at a predetermined rate.

Figure 2:
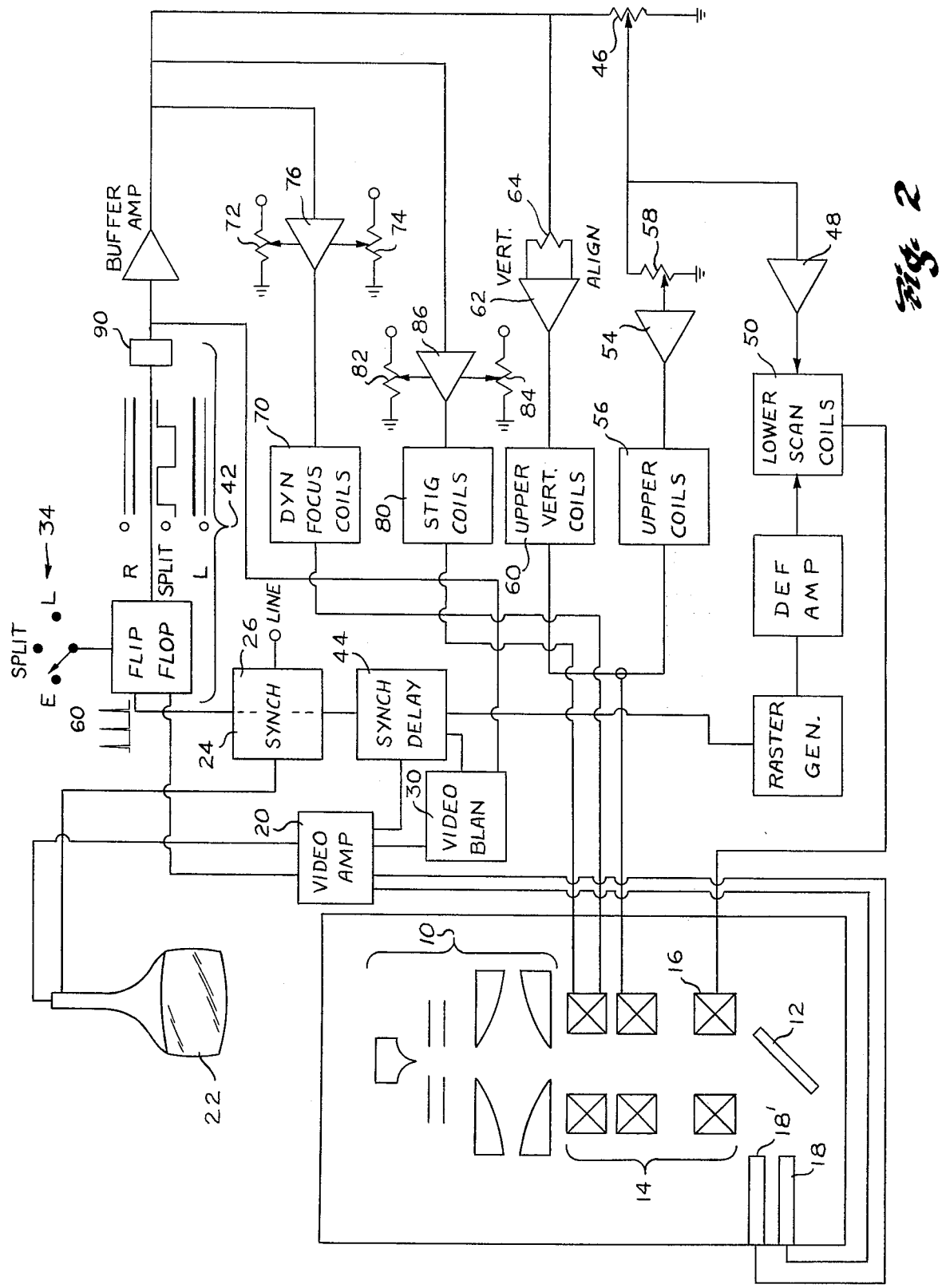
FIG. 2 is a diagramatical view of the stereo eys viewer of FIG. 1.

Referring now to FIGS. 2*a* and 2*b*, the stereo viewer 32 which provides simultaneous viewing of the separate left and right images and the generation in the viewer's mind of the stereoptic image. As will be subsequently explained, FIG. 2 illustrates the side-by-side left and right images are generated on the tube face 22*a* of the monitor 22 of FIG. 1. The viewer optics at a distance $Z_r$ (FIG. 2*b*) superimposes the two images at an apparent distance $Z_a$. The convergence angle $\beta$ is achieved by the combined effects of a pair of prisms and a pair of lenses, while the focus of the observers eyes on each image is removed to the same distance $Z_a$ by means of the lens pair only. This matching convergence and focus results in the most comfortable stereo viewing.

The creation of the split screen, simultaneous side-by-side images is illustrated in FIGS. 3 and 4*a* through 4*c*. Novel generation of the side-by-side images is obtained through the continuous scanning of the sample surface and the entire face of the monitor, with appropriate use of coordinated video blanking on the monitor face and shifting of the stereo incidence angle. In the incidence of comparative viewing of the different responsive return (eg, backscattered vs. secondary electron return) the blanking is coordinated with shift of detector function. The present detailed description will be devoted to the production of the stereo images, and comparative viewing will be discussed later.

For one field, which in the described embodiment is 1/60th of a second, the television video is blanked on the last one half of each horizontal scan line. This, then, causes the right hand one half of the monitor screen to be dark. Correspondingly, the left side of the screen generates an image according to whatever signal is input to the monitor beam brightness control. In this stereo example, the microprobe beam is scanning the sample at the incidence angle $\alpha 1$, as is illustrated on FIG. 3a. Upon completion of the first field, the video blanking is applied to the left, or first one half of each horizontal scan line and the second half or the right hand portion is imaged on the face of the monitor, providing an image according to the detected response of the microprobe beam striking the surface of the sample at the opposite stereo incidence angle $\alpha_r$.

Figure 3A:
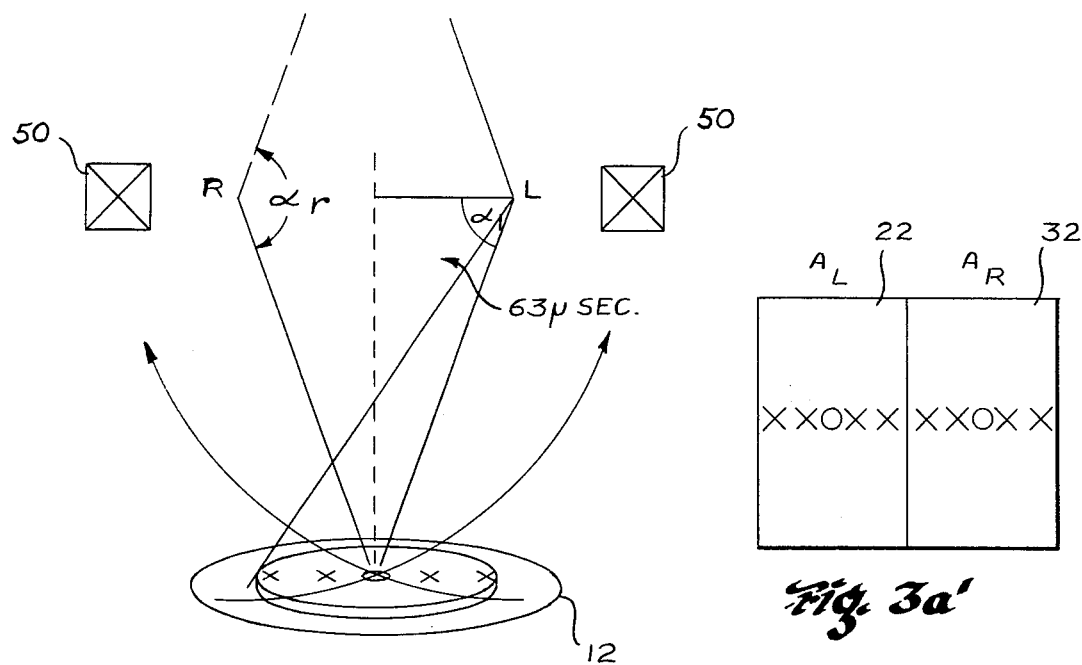
FIG. 3 is a ray diagram of microprobe beam scanning according to the invention.
Figure 3B:
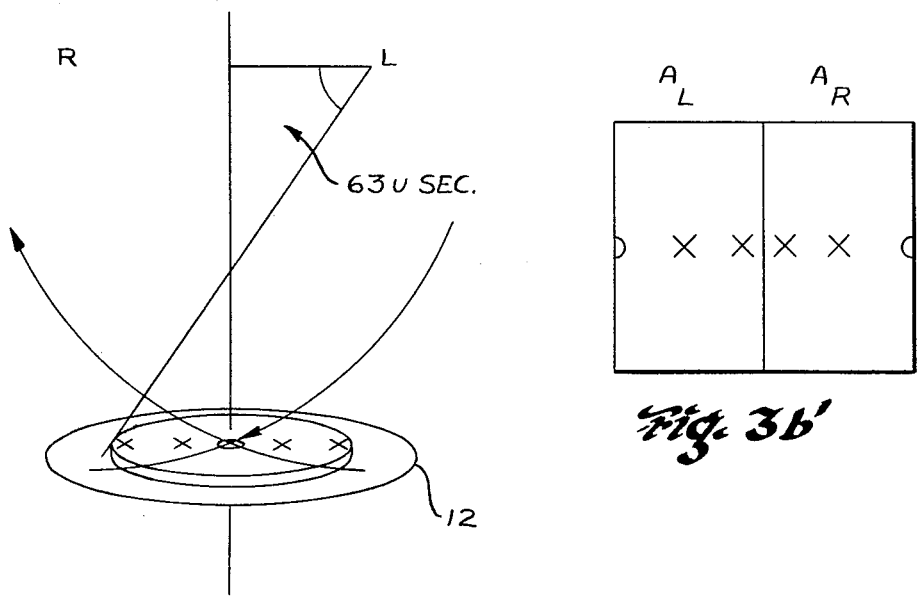

It may be realized that a change in magnification of the microscope could cause a misalignment of the left and right images on the monitor. This is illustrated in FIG. 3b wherein lateral displacement of the previously aligned images may be seen. Change in amplitude of horizontal sweep amplitude resulting from change of magnification of the microscope causes the image to be shifted to the left. If this horizontal sweep is held in phase with the television horizontal sweep and no magnification dependent offset is injected, the left and right unblanked centers don't remain coincident. In order to ensure that the areas A$r$ and A$l$ on the sample remain coincident with the other, with changes in area size, as caused by change in magnification, a phase shift is introduced between the television horizontal sweep and the microprobe horizontal sweep. This is illustrated in FIG. 4. FIG. 4a shows that the horizontal synchronization and sweep of the televison are caused to remain unchanged at all times. However, while the right half of the television video is blanked, the synchronization and horizontal sweep of the microprobe beam striking the sample are changed in phase with respect to those of the television (FIG. 4b). The horizontal ramp of the beam coincides timewise with the center of the left half of the television. In this way a change in magnification (or horizontal ramp amplitude) does not shift, causing a lateral shift of the image. During the succeeding field, or 1/60th of a second, while the left half of the television is blanking, and the beam horizontal synchronization and ramp are shifted in phase to the center ramp or the middle of the right half of the television screen. Once again, it may be observed that with the above procedure, the change in magnificaiton of the microscope causes no change or lateral motion of the image.

In the illustrated embodiment the rate at which the beam is switched between left and right incident angles is 60 Hz. For geographic areas with electrical power systems of different frequency, the preferred instrument would be of similar frequency to take advantage of the synchronization. The synchronization signal for this switching is obtained from the normal vertical synchronization source, for the scanning electron microscope, which is 24 on FIG. 1 and 24 on FIG. 5. A square wave of 30 Hz rate is generated as a stereo reference by flip flop 42. As illustrated, when the stereo control (flip flop 42) is selected to either the right or left position, a constant d-c signal is output, the polarity being reversed, one with respect to the other. This output signal thus becomes the master instruction to the instrument as to stereo function. According to the instruction of the stereo control, the blanking control will perform the proper synchronized blanking of the monitor, based upon whether the flip flop indicates the generation of the right hand or left hand image at the sample.

The stereo reference source 42 inputs a signal to the video blanking control 30 so that a square wave output may be generated for blanking instruction. This signal includes the variable pulse length information necessary to cause proper centering of the division line between the left and right images. This signal is illustrated at FIG. 5a as including the horizontal retrace of the television horizontal synchronization, a 63 microsecond signal. The blanking signal generator output reflects the lack of a blanking signal in those instances where the system is operated in left or right mode and the flip flop stereo reference outputs a steady plus or minus d-c signal.

The stereo control of the microprobe beam (14 of FIG. 1) includes (on FIG. 5) a horizontal sync delay 44 to accommodate for the previously discussed change of magnification. The phase of the delayed synchronization with respect to the television synchronization is determined by the square wave input from the stereo reference 42. To accomplish the double deflection of the microprobe beam, the stereo reference output is supplied to a variable voltage divider 46. The voltage signal picked off of divider 46 is supplied to a current generator 48 which, in turn, is supplied to the lower set of horizontal deflection coils 50 within the microscope column. This 30 Hz flip flop stereo reference signal is superimposed on the 15 Hz horizontal sweep signal being output by the deflection amplifier 52. These signals are shown as electrically superimposed on a single coil. It should be recognized that the superimposition may be accomplished magnetically, by separate coils, disposed adjacently. In order to counteract this sidestep of the beam, or to bring it back onto the sample, at the desired incidence angle, the same flip flop reference signal is current referenced, in amplifier 54 and supplied to the upper horizontal deflection coils 56. Recognizing that adjustment of these deflection signals with respect to each other may be necessary, a voltage divider 58 is provided. This provision enables location of the convergence point of the microprobe beam for the left and right paths. Once this convergence point has been established, i.e., positioned on a point of interest on the sample, the stereo effect may be altered by varying control 46, in effect, varying the gain of the stereo amplifier.

Vertical alignment of the left and right images is accomplished by supplying the stereo reference square wave to the upper vertical deflection coils 60 via a current source 62. A voltage divider 64 on the input side of the current amplifier 62 allows for adjustment of the input of the signal to the upper vertical deflection coils.

In order to optimally focus the left and right images a small electromagnetic lens 70 is provided in the column of the instrument. The current to the coil of lens 70 is adjustable through separate voltage dividers 72 and 74 in an amplifier 76 which provides the input to the coils 70. The divider 72 is operatively connected to function in conjunction with the stereo reference signal at the left image position and divider 74 operatively connected to function in conjunction with the stereo reference signal at the right image position.

Similarly, independent stigmation of the left and right images is effected by feeding two separate control inputs 82 and 84 into a gate circuit 86 which is fed by the stereo reference signal. According to which of the image positions is being interrogated, the selected astigmatism correction for left and right image is supplied to the stigmantor coils 80 in the electron microscope column.

As a matter of convenience, a reversal switch 90 is included in the stereo reference signal circuit. Upon reversal of the position of the switch 90, the phase of the stereo reference signal going to all beam deflection and focus circuitry is changed. This results in the left view of the specimen being presented on the right side of the television monitor and the right view on the left side of the television monitor. This reversal is useful to instrument operators who wish to observe the stereopsis by eye accommodation (crossed eyes) and without the aid of stereo viewer 32 (FIG. 1). For those applications where it is desirable to compare different classes of emission response from the sample 12, an additional detector 18' may be included within the electron microscope. The output of this detector, as with detector 18, is supplied to the video amplifier 20'. The stereo reference circuit 42 now operating strictly as a flip-flop, may gate the response of these detectors to sequentially appear as the left and right images of monitor 22. Similarly, with the stereoscopic embodiment an entire field will be imaged on one side of the monitor such as to output from detector 18 giving perhaps back-scattered electron information. The successive field placed on the right side of the monitor may be that provided by detector 18' which could be secondary electron response from the sample 12. The function of the stereo control circuit in this case would be to alternately provide monitor 22 with the information from detector 18 or 18' according to the flip-flop circuit's instructions to the monitor and the blanking circuits as to which of the left or right images is being generated.

It will be recognized by those skilled in the art that numerous other variations of the illustrative apparatus may be accomplished. It, however, should also be appreciated that these may properly be considered as falling within the scope and spirit of the present invention.

I claim:

1. In a scanning charged particle microprobe system including a source of charged particles, means for collimating said particles into a beam, means for scanning said beam in a predetermined raster pattern over a specimen in said microprobe system, detector means including means for generating a signal proportional to charged particles detected, CRT image recording means connected to said detector means to record detection of charged particles exiting said specimen, the improvement comprising:
   means synchronizing scan of beam of microprobe to the beam of said CRT;
   means for blanking a first predetermined portion of such horizontal sweep of said CRT beam scan for one field of said scan;
   means for causing the beam of said microprobe to scan specimen at a first predetermined average angle of incidence for the field of said first field of CRT beam blanking;
   means for blanking a second predetermined portion of each horizontal sweep of said CRT beam scan for a second field of scan; and
   means for causing the beam of said microprobe to scan said specimen at a second predetermined average angle of incidence for the second field of said second field of CRT beam blanking, at least a portion of the horizontal sweep of said second field blanking being mutually distinct from a part of the horizontal sweep of said first field blanking.
   whereby side-by-side images responsive to the sweep of said microprobe are produced on said CRT.

2. The microprobe according to claim 1 wherein said blanked field portions correspond to sequently the first and second halves of the horizontal scan of said CRT.

3. The microprobe according to claim 1 wherein in synchronizing the scan of said microprobe beam to the scan of said CRT recorder, said microprobe beam is phase shifted such that said horizontal ramp of said beam coincides with a predetermined point of said CRT scan.

4. The microprobe according to claim 2 including means for individual focus for said microprobe beam for each of said different average incidence angles.

5. The microprobe according to claim 2 including means for individual stigmation for said microprobe beam for each of said different average incidence angles.

6. The microprobe according to claim 2 including a square wave generator of frequency $f/2$ synchronized to the synchronization control of said CRT recorder and a square wave video blanking control synchronized thereto, and having means to vary the pulse length of said video blanking control whereby the division between said first and second fields may be adjusted.

7. In a scanning charged particle microprobe system including a source of charged particles, means for collimating said particles into a beam, means for scanning said beam in a predetermined raster pattern over a specimen in said microprobe system, detector means including means for generating a signal porportional to charged particles detected, CRT image recording means connected to said detector means to record detection of charged particles exiting said specimen, the improvement comprising:
   means synchronizing scan of beam of microprobe to the beam of said CRT;
   means for blanking a first predetermined portion of such horizontal sweep of said CRT beam scan for one field of said scan;
   means for blanking a second predetermined portion of each horizontal sweep of said CRT beam scan for a second field of scan;
   means for detecting charged particles emitted by said specimen in response to impingement of said beam on said specimen;
   means for detecting a predetermined class of charged particles and recording the detection of said particles on said CRT during said first blanked field; and
   means for detecting a second predetermined class of charged particles and recording the detection of said particles on said CRT during said second blanked field,
   whereby side-by-side images representative of two classes of charged particle emission of a single area of said specimen are displayed on a CRT image recorder.

* * * * *